(12) United States Patent
Wu et al.

(10) Patent No.: US 11,456,400 B2
(45) Date of Patent: Sep. 27, 2022

(54) LIGHT-EMITTING DIODE AND METHOD FOR TRANSFERRING THE SAME

(71) Applicant: XIAMEN SANAN OPTOELECTRONICS TECHNOLOGY CO., LTD., Xiamen (CN)

(72) Inventors: Zheng Wu, Xiamen (CN); Chia-En Lee, Xiamen (CN); Chen-Ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 192 days.

(21) Appl. No.: 16/895,119

(22) Filed: Jun. 8, 2020

(65) Prior Publication Data

US 2020/0303595 A1  Sep. 24, 2020

Related U.S. Application Data

(63) Continuation-in-part of application No. PCT/CN2018/085128, filed on Apr. 28, 2018.

(30) Foreign Application Priority Data

Dec. 11, 2017  (CN) .......................... 201711306978.0

(51) Int. Cl.
*H01L 33/48* (2010.01)
*H01L 33/00* (2010.01)
(Continued)

(52) U.S. Cl.
CPC ............ *H01L 33/483* (2013.01); *H01L 25/13* (2013.01); *H01L 33/0093* (2020.05);
(Continued)

(58) Field of Classification Search
CPC .... H05K 1/111; H05K 3/305; H01L 21/6835; H01L 2221/68354; H01L 2221/68368;
(Continued)

(56) References Cited

U.S. PATENT DOCUMENTS

2016/0086855 A1* 3/2016 Bower .................... H01L 24/83
257/798
2017/0117257 A1* 4/2017 Lee .......................... H01L 33/32
(Continued)

FOREIGN PATENT DOCUMENTS

CN   105826435   8/2016
CN   106058010   10/2016
(Continued)

OTHER PUBLICATIONS

International Search Report for PCT/CN2018/085128 dated Sep. 25, 2018.
(Continued)

*Primary Examiner* — Mark W Tornow
*Assistant Examiner* — Priya M Rampersaud
(74) *Attorney, Agent, or Firm* — Thomas|Horstemeyer, LLP

(57) ABSTRACT

Disclosed is a light-emitting diode including an epitaxial laminate, a first electrode, and a second electrode. The epitaxial laminate includes a first type semiconductor layer, a second type semiconductor layer, and a light-emitting layer. The first type semiconductor layer has an outer surface, and a recess extending inwardly from the outer surface. Also disclosed is a method for transferring the light-emitting diode.

22 Claims, 5 Drawing Sheets

(51) Int. Cl.
*H01L 25/13* (2006.01)
*H01L 33/20* (2010.01)
*H01L 33/38* (2010.01)
*H01L 33/40* (2010.01)

(52) U.S. Cl.
CPC .............. *H01L 33/20* (2013.01); *H01L 33/38* (2013.01); *H01L 33/40* (2013.01)

(58) Field of Classification Search
CPC . H01L 2221/68304; H01L 2221/68381; H01L 2221/68318; H01L 2224/02313; H01L 2224/03; H01L 2224/11; H01L 2224/13012; H01L 2224/94; H01L 2924/12041; H01L 24/83; H01L 24/32; H01L 24/08; H01L 2221/68363; H01L 25/0753; H01L 25/13; H01L 33/0093; H01L 33/20; H01L 33/38; H01L 33/40; H01L 33/483; H01L 33/486; H01L 23/32; H01L 27/156; H01L 33/005; H01L 33/62
See application file for complete search history.

(56) References Cited

U.S. PATENT DOCUMENTS

| | | | |
|---|---|---|---|
| 2017/0133818 A1* | 5/2017 | Cok | G02B 5/003 |
| 2018/0006186 A1* | 1/2018 | Bower | H01L 33/36 |
| 2018/0174910 A1* | 6/2018 | Bower | H01L 25/50 |
| 2019/0051552 A1* | 2/2019 | Bower | H01L 33/0095 |

FOREIGN PATENT DOCUMENTS

| | | |
|---|---|---|
| CN | 106941108 | 7/2017 |
| CN | 107170773 | 9/2017 |
| JP | H09148225 A | 6/1997 |
| WO | 2016184769 A1 | 11/2016 |

OTHER PUBLICATIONS

Search Report appended to an Office Action, which was issued to Chinese counterpart application No. 201711306978.0 by the CNIPA dated Mar. 25, 2019, with an English translation thereof.

* cited by examiner

LIGHT-EMITTING DIODE AND METHOD FOR TRANSFERRING THE SAME

CROSS-REFERENCE TO RELATED APPLICATION

This application is a bypass continuation-in-part application of International Application No. PCT/CN2018/085128 filed on Apr. 28, 2018, which claims priority of Chinese Patent Application No. 201711306978.0 filed on Dec. 11, 2017. The entire content of each of the international and Chinese patent applications is incorporated herein by reference.

FIELD

The disclosure relates to a light-emitting diode, and more particularly to a light-emitting diode to be transferred. The disclosure also relates to a method for transferring the light-emitting diode.

BACKGROUND

Micro light-emitting diodes (mLEDs), which have advantages such as low power consumption, high brightness, very high dissolution and color saturation, fast response, low energy consumption, and long lifetime, etc., have been widely researched due to their potential as a next generation display light source. In addition, the power consumption of mLEDs is about 10% of that of liquid crystal displays (LCDs) and about 50% of that of organic light-emitting diodes (OLEDs). Furthermore, mLEDs have a brightness which is 30 times higher than that of OLEDs that are self-emissive like mLEDs, and a dissolution of 1500 PPI (pixels per inch). Since mLEDs has these significant advantages, they are promising as substitutes for presently used OLEDs and LCDs to become the next generation display light sources.

However, mLEDs have yet to be mass produced due to various technical difficulties. One of these difficulties is how to enhance the efficiency for transferring mLEDs.

SUMMARY

An object of the disclosure is to provide a solution to address the drawback of the prior art.

According to a first aspect of the disclosure, there is provided a light-emitting diode, which includes an epitaxial laminate, a first electrode, and a second electrode. The epitaxial laminate includes a first type semiconductor layer, a second type semiconductor layer, and a light-emitting layer. The first type semiconductor layer has an outer surface, and a recess extending inwardly from the outer surface. The light-emitting layer is interposed between the first type semiconductor layer and the second type semiconductor layer, and is distal from the outer surface. The first electrode is connected to the first type semiconductor layer, and the second electrode is connected to the second type semiconductor layer.

According to a second aspect of the disclosure, there is provided a light-emitting device, which includes an outer support member, the light-emitting diode described above, and a connecting unit. The outer support member has an upper surface with an opening, and a receiving space extending inwardly from the opening. The light-emitting diode is received in the receiving space and is spaced apart from the outer support member. The connecting unit is disposed on the upper surface of the outer support member and the outer surface of the first type semiconductor layer of the light-emitting diode to interconnect the light-emitting diode and the outer support member so as to permit the light-emitting diode to be suspended in the receiving space.

According to a third aspect of the disclosure, there is provided a light-emitting device matrix which includes a plurality of the light-emitting devices described above.

According to a fourth aspect of the disclosure, there is provided a method for transferring a light-emitting diode, which includes the steps of:

a) providing the light-emitting diode described above;

b) covering the light-emitting diode with a sacrificial layer in a manner such that the outer surface of the first type semiconductor layer of the light-emitting diode is exposed from the sacrificial layer;

c) covering the sacrificial layer with the outer support member;

d) bonding a bottom portion of the outer support member to a substrate such that the light-emitting diode is disposed above the bottom portion of the outer support member;

e) interconnecting the light-emitting diode and the outer support member using the connecting unit;

f) removing the sacrificial layer such that the light-emitting diode and the outer support member are spaced apart from each other by a gap;

g) inserting an adhesive protrusion of a transfer member into the recess of the first type semiconductor layer of the light-emitting diode to permit the adhesive protrusion to adhere to the light-emitting diode; and h) breaking the connecting unit such that the light-emitting diode is separated from the outer support member and is transferred from the outer support member by the transfer member.

In the present disclosure, the first type semiconductor layer of the light-emitting diode is provided with the recess which can be inserted by the adhesive protrusion of the transfer member to permit the adhesive protrusion to be adhered to the light-emitting diode. Therefore, the light-emitting diode can be transferred by the transfer member effectively. The transfer efficiency and the reliability of the light-emitting diode can be enhanced accordingly.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
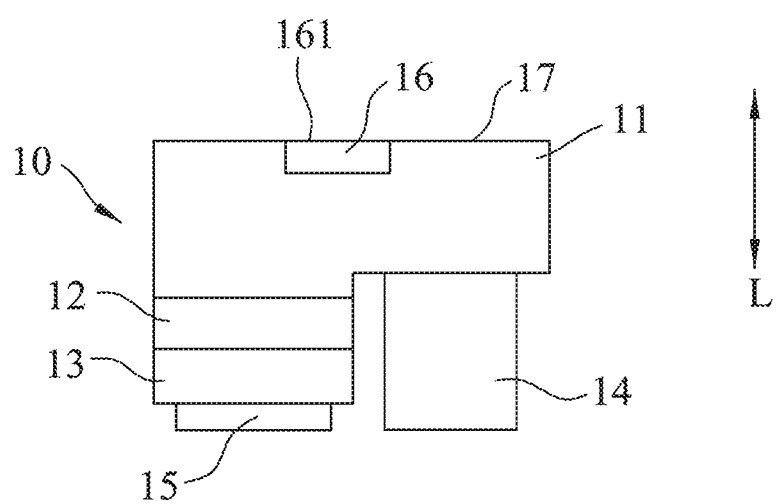
FIG. 1 is a schematic side view of an embodiment of a light-emitting diode according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

A light-emitting diode according to the disclosure includes an epitaxial laminate, a first electrode, and a second electrode. The epitaxial laminate includes a first type semiconductor layer, a second type semiconductor layer, and a light-emitting layer. The first type semiconductor layer has an outer surface, and a recess extending inwardly from the outer surface. The light-emitting layer is interposed between the first type semiconductor layer and the second type semiconductor layer, and is distal from the outer surface. The first electrode is connected to the first type semiconductor layer, and the second electrode is connected to the second type semiconductor layer.

In certain embodiments, the recess has an opening with a center which is misaligned with a chip center in a longitudinal direction transverse to the outer surface of the first type semiconductor layer.

In certain embodiments, the center of the opening of the recess is misaligned with a center of the outer surface of the first type semiconductor layer in the longitudinal direction.

In certain embodiments, the recess has a depth ranging from 0.1 µm to 1.0 µm.

In certain embodiments, the recess extends convergingly from the outer surface of the first type semiconductor layer.

In certain embodiments, the first and second electrodes are disposed on a same surface of the epitaxial laminate.

In certain embodiments, the first and second electrodes are disposed on different surfaces of the epitaxial laminate.

In certain embodiments, the light-emitting diode is configured as a flip type structure, a face-up type structure, or a vertical type structure.

In certain embodiments, the light-emitting diode is a micro light-emitting diode having a chip size of up to 100 µm×100 µm.

In certain embodiments, the opening of the recess has an area ranging from 30% to 50% of an area of the outer surface of the first type semiconductor layer.

A light-emitting device according to the disclosure includes an outer support member, the light-emitting diode described above, and a connecting unit. The outer support member has an upper surface with an opening, and a receiving space extending inwardly from the opening. The light-emitting diode is received in the receiving space and is spaced apart from the outer support member. The connecting unit is disposed on the upper surface of the outer support member and the outer surface of the first type semiconductor layer of the light-emitting diode to interconnect the light-emitting diode and the outer support member so as to permit the light-emitting diode to be suspended in the receiving space.

In certain embodiments, the connecting unit includes at least two connecting members.

In certain embodiments, the connecting members are misaligned with the recess of the first type semiconductor layer.

In certain embodiments, the connecting unit is made of a dielectric material.

In certain embodiments, the connecting unit is made of $SiO_2$, SiN, AlN, $Al_2O_3$, or combinations thereof.

In certain embodiments, each of the connecting members includes a bottom elongate portion and a top elongate portion. The bottom elongate portion is disposed on the upper surface of the outer support member and the outer surface of the first type semiconductor layer of the light-emitting diode. The top elongate portion is disposed on the bottom elongate portion. The top and bottom elongate portions respectively have end regions which are configured in a stepped arrangement. The top elongate portion has a thickness ranging from 10% to 50% of a total thickness of the top and bottom elongate portions.

In certain embodiments, the light-emitting diode is spaced apart from the outer support member in the longitudinal direction by a distance which is equal to at least a thickness of the connecting unit.

In certain embodiments, the outer support member is made of a benzocyclobutene adhesive, an ultraviolet adhesive, a resin, or combinations thereof.

In certain embodiments, the light-emitting device further includes a substrate disposed beneath the outer support member.

In certain embodiments, the opening of the recess of the first type semiconductor layer included in the light-emitting diode has an area ranging from 30% to 50% of an area of the outer surface of the first type semiconductor layer.

In certain embodiments, the center of the opening of the recess of the first type semiconductor layer included in the light-emitting diode is misaligned with a center of the outer surface of the first type semiconductor layer in the longitudinal direction.

In certain embodiments, the recess of the first type semiconductor layer included in the light-emitting diode has a depth ranging from 0.1 µm to 1.0 µm.

In certain embodiments, the recess of the first type semiconductor layer included in the light-emitting diode extends convergingly from the outer surface of the first type semiconductor layer.

In certain embodiments, the first and second electrodes included in the light-emitting diode are disposed on a same surface of the epitaxial laminate included in the light-emitting diode.

In certain embodiments, the first and second electrodes included in the light-emitting diode are disposed on different surfaces of the epitaxial laminate included in the light-emitting diode.

In certain embodiments, the light-emitting diode is configured as the flip type structure, the face-up type structure, or the vertical type structure.

In certain embodiments, the light-emitting diode is a micro light-emitting diode having dimensions of up to 100 µm×100 µm.

A light-emitting device matrix according to the disclosure includes a plurality of the light-emitting devices described above.

A method for transferring a light-emitting diode according to the disclosure includes the steps of:

a) providing the light-emitting diode described above;

b) covering the light-emitting diode with a sacrificial layer in a manner such that the outer surface of the first type semiconductor layer of the light-emitting diode is exposed from the sacrificial layer;

c) covering the sacrificial layer with the outer support member;

d) bonding a bottom portion of the outer support member to a substrate such that the light-emitting diode is disposed above the bottom portion of the outer support member;

e) interconnecting the light-emitting diode and the outer support member using the connecting unit;

f) removing the sacrificial layer such that the light-emitting diode and the outer support member are spaced apart from each other by a gap;

g) inserting an adhesive protrusion of a transfer member into the recess of the first type semiconductor layer of the light-emitting diode to permit the adhesive protrusion to adhere to the light-emitting diode; and h) breaking the connecting unit such that the light-emitting diode is separated from the outer support member and is transferred from the outer support member by the transfer member.

In certain embodiments, the transfer member is made of polydimethylsiloxane, silicone, a thermal release adhesive, an ultraviolet adhesive, or combinations thereof.

In certain embodiments, the recess of the first type semiconductor layer included in the light-emitting diode has the opening with the center which is misaligned with the chip center in the longitudinal direction.

In certain embodiments, the recess of the first type semiconductor layer included in the light-emitting diode extends convergingly from the outer surface of the first type semiconductor layer.

In certain embodiments, the light-emitting diode is configured as the flip type structure, the face-up type structure, or the vertical type structure.

In certain embodiments, the connecting unit is made of $SiO_2$, SiN, AlN, $Al_2O_3$, or combinations thereof.

Embodiment 1

Referring to FIG. 1, an embodiment of a light-emitting diode according to the disclosure is a a micro light-emitting diode having dimensions of up to 100 μm×100 μm, and includes an epitaxial laminate 10, a first electrode 14, and a second electrode 15.

The epitaxial laminate 10 includes a first type semiconductor layer 11, a second type semiconductor layer 13, and a light-emitting layer 12. The first type semiconductor layer 11 has an outer surface 17 and a recess 16 extending inwardly from the outer surface 17. The light-emitting layer 12 is interposed between the first type semiconductor layer 11 and the second type semiconductor layer 13, and is distal from the outer surface 17.

The first electrode 14 is connected to the first type semiconductor layer 11, and the second electrode 15 is connected to the second type semiconductor layer 13. The first and second electrodes 14, 15 are disposed on a same surface of the epitaxial laminate 10. Alternatively, the first and second electrodes 14, 15 may be disposed on different surfaces of the epitaxial laminate 10 according to a specific configuration designed for the light-emitting diode. Specifically, the light-emitting diode according to the disclosure can be configured as a flip type structure, a face-up type structure, or a vertical type structure. In the flip and face-up type structures, the first and second electrodes 14, 15 are disposed on the same surface of the epitaxial laminate 10. In the vertical type structure, the first and second electrodes 14, 15 is disposed on the different surfaces of the epitaxial laminate 10.

The recess 16 is formed in the outer surface 17 of the first type semiconductor layer 11, as described above, and is used for transferring the light-emitting diode. Alternatively, the recess 16 may be formed at different positions of other configurations designed for the light-emitting diode to be transferred. For example, the recess 16 may be formed in the first electrode 14 of the light-emitting diode configured as the vertical type structure, or in the substrate of the light-emitting diode configured as the flip or face-up type structure.

Figure 2:
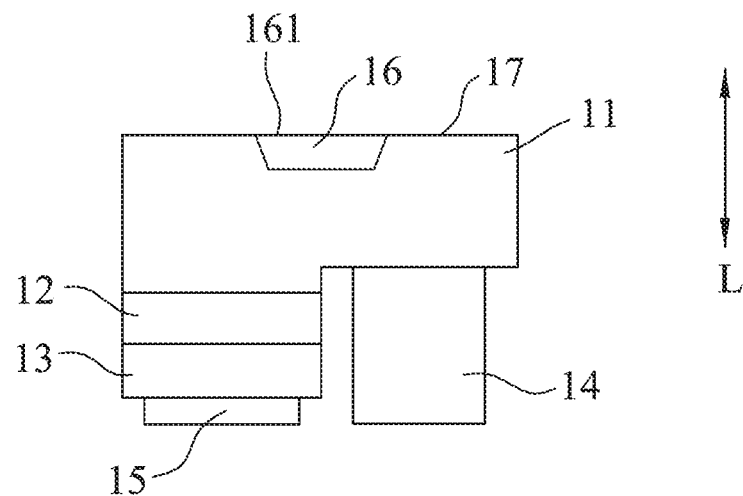
FIG. 2 is a schematic side view of a variant of the embodiment shown in FIG. 1.
Figure 3:
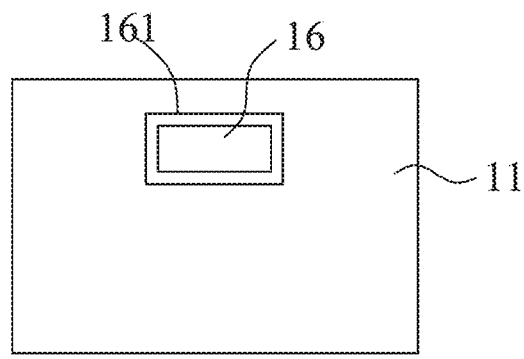
FIG. 3 is a schematic top view of the variant shown in FIG. 2.

Referring to FIGS. 2 and 3, a variant of the embodiment of the light-emitting diode according to the disclosure is illustrated, in which the recess 16 extends convergingly from the outer surface 17 of the first type semiconductor layer 11. It should be noted that the recess 16 may be formed as other geometries (for example, a cross-shaped geometry) in addition to those illustrated in FIGS. 1 to 3.

The recess 16 has an opening 161 with a center which is misaligned with a chip center in a longitudinal direction (L) transverse to the outer surface 17 of the first type semiconductor layer 11, so as to produce a rotation torque during transfer of the light-emitting diode. Alternatively, the center of the opening 161 of the recess 16 may be misaligned with a center of the outer surface 17 of the first type semiconductor layer 11 in the longitudinal direction (L), as shown in FIG. 3.

The opening 161 of the recess 16 has an area ranging from 30% to 50% of an area of the outer surface 17 of the first type semiconductor layer 11. Furthermore, the recess 16 has a depth ranging from 0.1 μm to 1.0 μm.

Embodiment 2

Figure 4:
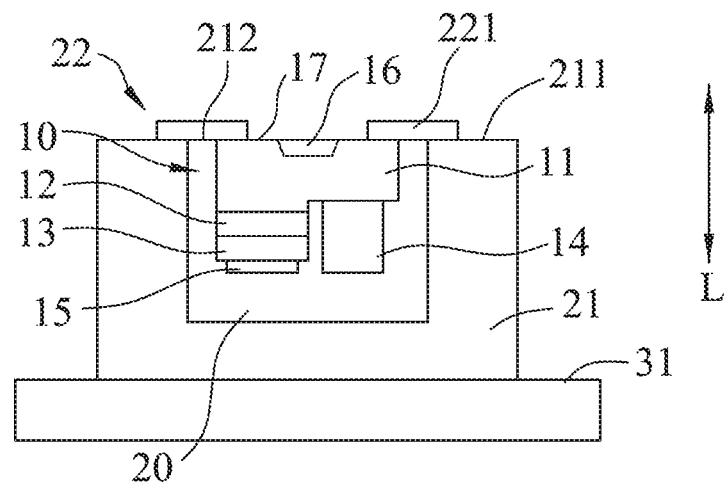
FIG. 4 is a schematic side view of an embodiment of a light-emitting device according to the disclosure.
Figure 5:
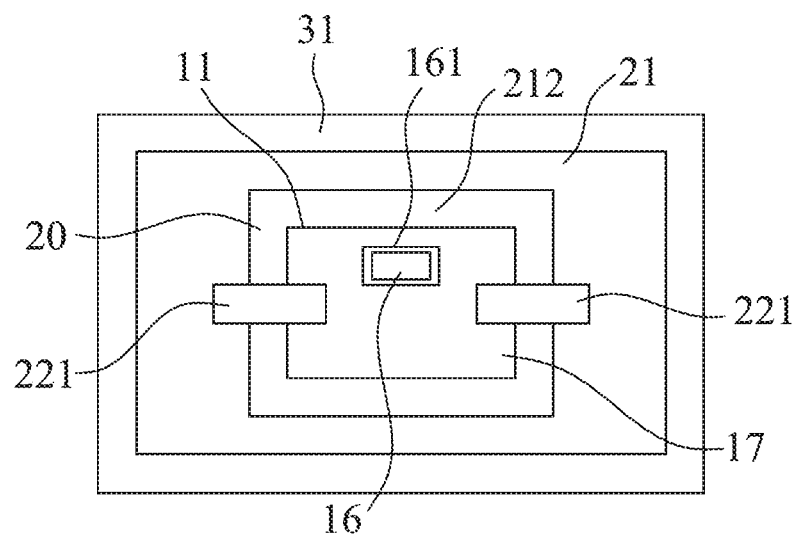
FIG. 5 is a schematic top view of the embodiment shown in FIG. 4.

Referring to FIGS. 4 and 5, an embodiment of a light-emitting device according to the disclosure includes an outer support member 21, the light-emitting diode described above, and a connecting unit 22.

The outer support member 21 has an upper surface 211 with an opening 212, and a receiving space 20 extending inwardly from the opening 212. The outer support member 21 has a height ranging from 1 μm to 20 μm, and is made of an inert material, such as a benzocyclobutene adhesive, an ultraviolet adhesive, a resin, or combinations thereof. In addition, a substrate 31 is disposed beneath the outer support member 21 so as to avoid deformation of the outer support member 21. The substrate 31 may be a sapphire sheet, a silicon sheet, a metal sheet, or the like.

The light-emitting diode is received in the receiving space 20, and is spaced apart from the outer support member 21 so as to provide a buffer space for picking up the light-emitting diode from the receiving space 20 during transfer of the light-emitting diode. As described above, the light-emitting diode includes the epitaxial laminate 10, the first electrode 14, and the second electrode 15. The epitaxial laminate 10 includes the first type semiconductor layer 11, the second type semiconductor layer 13, and the light-emitting layer 12. The first type semiconductor layer 11 has the outer surface 17 and the recess 16 extending inwardly from the outer surface 17. The first electrode 14 is connected to the first type semiconductor layer 11, and the second electrode 15 is connected to the second type semiconductor layer 13. The opening 161 of the recess 16 has an area ranging from 30% to 50% of an area of the outer surface 17 of the first type semiconductor layer 11.

As described above, the first and second electrodes 14, 15 may be disposed on the same surface or different surfaces of the epitaxial laminate 10 according to specific configurations designed for the light-emitting diode. The light-emitting diode is a micro light-emitting diode having dimensions of up to 100 μm×100 μm, and may be configured as the flip type structure, the face-up type structure, or the vertical type structure.

The connecting unit 22 is disposed on the upper surface 211 of the outer support member 21 and the outer surface 17 of the first type semiconductor layer 11 of the light-emitting diode to interconnect the light-emitting diode and the outer support member 21 so as to permit the light-emitting diode to be suspended in the receiving space 20.

The connecting unit 22 includes at least two connecting members 221 which provide a bonding strength sufficient to bond the light-emitting diode to permit the light-emitting diode to be suspended in the receiving space 20. When the connecting unit 22 is configured as a single connecting member 221, the bonding strength provided by the connecting member 221 may be insufficient for suspending the light-emitting diode in the receiving space 20. Otherwise, the connecting member 221 should have a relatively large size to provide sufficient bonding strength, so that the connecting member 221 would not be easily broken during transfer of the light-emitting diode.

When the connecting unit 22 is configured as two connecting members 221, as illustrated in FIG. 5, a width of each of the connecting members 221 is in a range from 8% to 20% of that of a corresponding side of the light-emitting diode. When each of the connecting members 221 has a width in such range, the connecting members 221 can provide sufficient bonding strength for suspending the light-emitting diode in the receiving space 20, and can be broken easily so as to transfer the light-emitting diode.

As described above, the recess 16 has a depth ranging from 0.1 µm to 1.0 µm, and the center of the opening 161 of the recess 16 is misaligned with the center of the outer surface 17 of the first type semiconductor layer 11 in the longitudinal direction (L). In addition, the connecting members 221 are misaligned with the recess 16 of the first type semiconductor layer 11, as shown in FIG. 5, so as to produce a rotation torque for breaking the connecting members 221 easily such that the light-emitting diode can be transferred from the receiving space 20 of the outer support member 21.

In order to break the connecting unit 22 easily, the connecting unit 22 is made of a dielectric material with brittleness. Examples of the dielectric material may include, but are not limited to, $SiO_2$, SiN, AlN, $Al_2O_3$, and combinations thereof.

The light-emitting diode is spaced apart from the outer support member 21 in the longitudinal direction (L) by a distance which is equal to at least a thickness of the connecting unit 22, so as to avoid damage of the light-emitting diode during breaking of the connecting unit 22.

Figure 6:
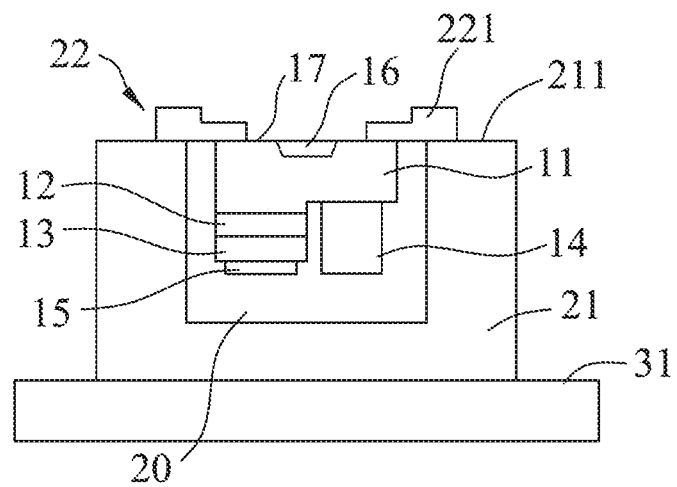
FIG. 6 is a schematic side view of a variant of the embodiment shown in FIGS. 4 and 5.

Referring to FIG. 6, a variant of the embodiment of the light-emitting device according to the disclosure is illustrated, in which each of the connecting members 221 includes a bottom elongate portion and a top elongate portion. The bottom elongate portion is disposed on the upper surface 211 of the outer support member 21 and the outer surface 17 of the first type semiconductor layer 11 of the light-emitting diode. The top elongate portion is disposed on the bottom elongate portion. The top and bottom elongate portions respectively have end regions which are configured in a stepped arrangement. The top elongate portion has a thickness ranging from 10% to 50% of a total thickness of the top and bottom elongate portions.

A plurality of the light-emitting devices can be assembled to form a light-emitting device matrix.

Embodiment 3

Figure 7:
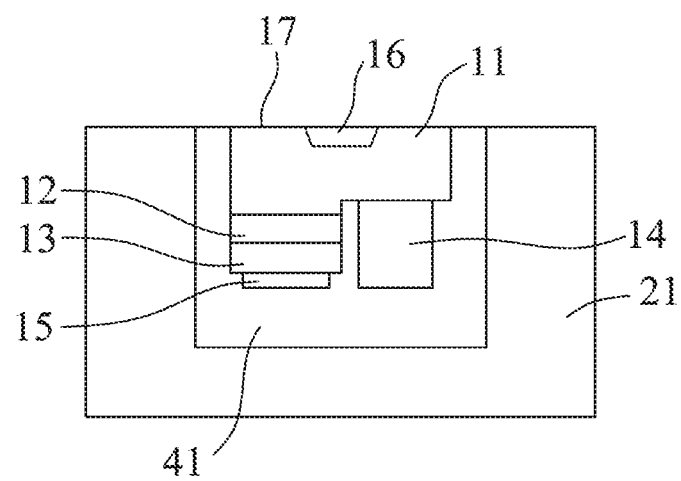
FIGS. 7 to 9 are schematic side views illustrating consecutive steps of an embodiment of a method for transferring a light-emitting diode according to the disclosure.
Figure 8:
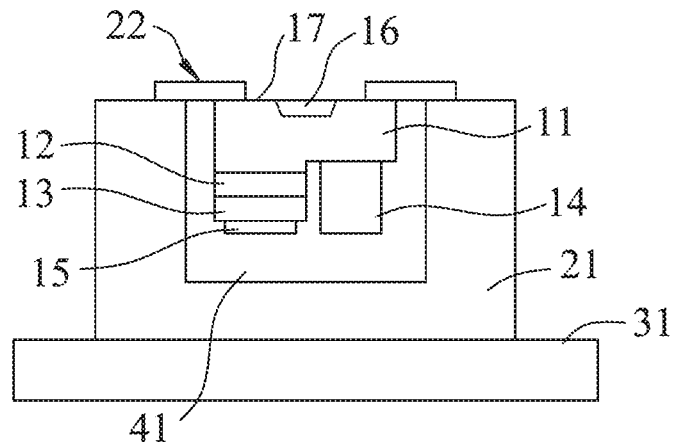
Figure 9:
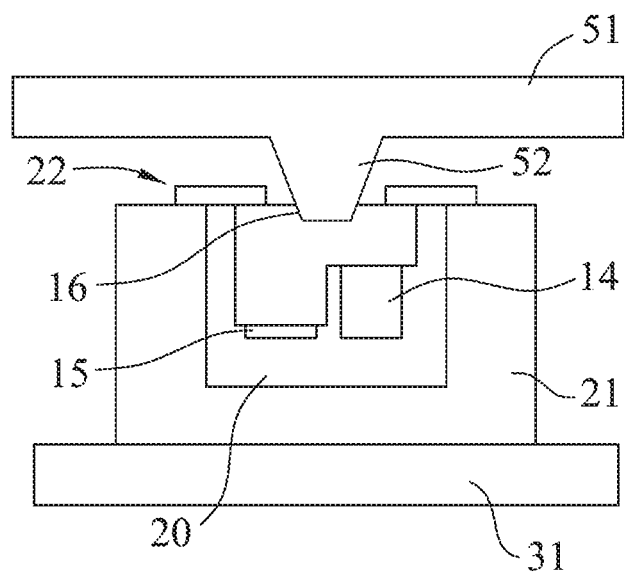

Referring to FIGS. 7 to 9, an embodiment of a method for transferring a light-emitting diode according to the disclosure includes the steps of:

a) providing the light-emitting diode described above;

b) covering the light-emitting diode with a sacrificial layer 41 in a manner such that the outer surface 17 of the first type semiconductor layer 11 of the light-emitting diode is exposed from the sacrificial layer 41;

c) covering the sacrificial layer 41 with the outer support member 21;

d) bonding a bottom portion of the outer support member 21 to the substrate 31 such that the light-emitting diode is disposed above the bottom portion of the outer support member 21;

e) interconnecting the light-emitting diode and the outer support member 21 using the connecting unit 22;

f) removing the sacrificial layer 41 such that the light-emitting diode and the outer support member 21 are spaced apart from each other by a gap;

g) inserting an adhesive protrusion 52 of a transfer member 51 into the recess 16 of the first type semiconductor layer 11 of the light-emitting diode to permit the adhesive protrusion 52 to adhere to the light-emitting diode; and h) breaking the connecting unit 22 such that the light-emitting diode is separated from the outer support member 21 and is transferred from the outer support member 21 by the transfer member 51.

In step g), the transfer member 51 is made of a adhesive material, such as polydimethylsiloxane, silicone, a thermal release adhesive, an ultraviolet adhesive, or combinations thereof.

Since only the adhesive protrusion 52 of the transfer member 51 is inserted into the recess 16 of the first type semiconductor layer 11 of the light-emitting diode to permit the adhesive protrusion 52 to adhere to the light-emitting diode, the transfer member 51 can be easily separated from the light-emitting diode after the light-emitting diode is transferred.

In view of the aforesaid, the first type semiconductor layer of the light-emitting diode is provided with the recess which can be inserted by the adhesive protrusion of the transfer member to permit the adhesive protrusion to adhere to the light-emitting diode. Therefore, the light-emitting diode can be transferred by the transfer member effectively, thereby enhancing the transfer efficiency and the reliability of the light-emitting diode.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:
an epitaxial laminate including
a first type semiconductor layer which has an outer surface and a recess extending inwardly from said outer surface,
a second type semiconductor layer, and
a light-emitting layer interposed between said first type semiconductor layer and said second type semiconductor layer and distal from said outer surface;
a first electrode connected to said first type semiconductor layer; and
a second electrode connected to said second type semiconductor layer,
wherein said recess has an opening with a center which is misaligned with a chip center in a longitudinal direction transverse to said outer surface of said first type semiconductor layer.

2. The light-emitting diode according to claim 1, wherein said center of said opening of said recess is misaligned with a center of said outer surface of said first type semiconductor layer in the longitudinal direction.

3. The light-emitting diode according to claim 1, wherein said recess has a depth ranging from 0.1 µm to 1.0 µm.

4. The light-emitting diode according to claim 1, wherein said recess extends convergingly from said outer surface of said first type semiconductor layer.

5. The light-emitting diode according to claim 1, wherein said first and second electrodes are disposed on a same surface of said epitaxial laminate.

6. The light-emitting diode according to claim 1, wherein said first and second electrodes are disposed on different surfaces of said epitaxial laminate.

7. The light-emitting diode according to claim 1, which is configured as a structure selected from the group consisting of a flip type structure, a face-up type structure, and a vertical type structure.

8. The light-emitting diode according to claim 1, which is a micro light-emitting diode having a chip size of up to 100 µm×100 µm.

9. The light-emitting diode according to claim 1, wherein said opening of said recess has an area ranging from 30% to 50% of an area of said outer surface of said first type semiconductor layer.

10. A light-emitting device, comprising:
an outer support member having
an upper surface with an opening, and
a receiving space extending inwardly from said opening;
the light-emitting diode according to claim 1 received in said receiving space and spaced apart from said outer support member; and
a connecting unit disposed on said upper surface of said outer support member and said outer surface of said first type semiconductor layer of the light-emitting diode to interconnect the light-emitting diode and said outer support member so as to permit the light-emitting diode to be suspended in the receiving space.

11. The light-emitting device according to claim 10, wherein said connecting unit includes at least two connecting members.

12. The light-emitting device according to claim 11, wherein said connecting members are misaligned with said recess of said first type semiconductor layer.

13. The light-emitting device according to claim 10, wherein said connecting unit is made of a dielectric material.

14. The light-emitting device according to claim 13, wherein said dielectric material is selected from the group consisting of $SiO_2$, SiN, AlN, $Al_2O_3$, and combinations thereof.

15. The light-emitting device according to claim 11, wherein each of said connecting members includes
a bottom elongate portion disposed on said upper surface of said outer support member and said outer surface of said first type semiconductor layer of the light-emitting diode, and
a top elongate portion disposed on said bottom elongate portion,
said top and bottom elongate portions respectively having end regions which are configured in a stepped arrangement, said top elongate portion having a thickness ranging from 10% to 50% of a total thickness of said top and bottom elongate portions.

16. The light-emitting device according to claim 10, wherein the light-emitting diode is spaced apart from said outer support member in a longitudinal direction transverse to said outer surface by a distance which is equal to at least a thickness of said connecting unit.

17. The light-emitting device according to claim 10, wherein said outer support member is made of a material selected from the group consisting of a benzocyclobutene adhesive, an ultraviolet adhesive, a resin, and combinations thereof.

18. The light-emitting device according to claim 10, further comprising a substrate disposed beneath said outer support member.

19. A light-emitting device matrix, comprising a plurality of light-emitting devices each according to claim 10.

20. A method for transferring a light-emitting diode, comprising the steps of:
a) providing the light-emitting diode according to claim 1;
b) covering the light-emitting diode with a sacrificial layer in a manner such that the outer surface of the first type semiconductor layer of the light-emitting diode is exposed from the sacrificial layer;
c) covering the sacrificial layer with an outer support member;
d) bonding a bottom portion of the outer support member to a substrate such that the light-emitting diode is disposed above the bottom portion of the outer support member;
e) interconnecting the light-emitting diode and the outer support member using a connecting unit;
f) removing the sacrificial layer such that the light-emitting diode and the outer support member are spaced apart from each other by a gap;
g) inserting an adhesive protrusion of a transfer member into the recess of the first type semiconductor layer of the light-emitting diode to permit the adhesive protrusion to adhere to the light-emitting diode; and
h) breaking the connecting unit such that the light-emitting diode is separated from the outer support member and is transferred from the outer support member by the transfer member.

21. The method according to claim 20, wherein the transfer member is made of a material selected from the group consisting of polydimethylsiloxane, silicone, a thermal release adhesive, an ultraviolet adhesive, and combinations thereof.

22. A light-emitting diode, comprising:
an epitaxial laminate including
a first type semiconductor layer which has an outer surface, a second type semiconductor layer, a light-emitting layer interposed between said first type semiconductor layer and said second type semiconductor layer and distal from said outer surface, and a recess extending inwardly from a surface of said epitaxial laminate and disposed proximate to said first type semiconductor layer;

a first electrode connected to said first type semiconductor layer; and a second electrode connected to said second type semiconductor layer, wherein said recess has an opening which is misaligned with a center of said epitaxial laminate.

* * * * *